(12) United States Patent
Ohtake et al.

(10) Patent No.: US 7,994,769 B2
(45) Date of Patent: Aug. 9, 2011

(54) SWITCHING REGULATOR AND CONTROL CIRCUIT THEREOF

(75) Inventors: Nobumasa Ohtake, Kyoto (JP); Nobuaki Umeki, Kyoto (JP)

(73) Assignee: Rohm Co., Ltd. (JP)

( * ) Notice: Subject to any disclaimer, the term of this patent is extended or adjusted under 35 U.S.C. 154(b) by 224 days.

(21) Appl. No.: 12/323,689

(22) Filed: Nov. 26, 2008

(65) Prior Publication Data

US 2010/0109625 A1    May 6, 2010

(30) Foreign Application Priority Data

Nov. 29, 2007 (JP) ................................ 2007-308318
Dec. 13, 2007 (JP) ................................ 2007-322369

(51) Int. Cl.
    *G05F 1/00* (2006.01)
(52) U.S. Cl. .................. 323/283; 323/284; 323/285
(58) Field of Classification Search .............. 323/244, 323/246, 282–285, 288, 290, 292; 363/125, 363/126
    See application file for complete search history.

(56) References Cited

U.S. PATENT DOCUMENTS

| 6,025,683 | A  | * | 2/2000 | Philipp .................... 318/257 |
| 6,597,157 | B1 | * | 7/2003 | Boeckmann et al. .......... 323/242 |
| 7,068,023 | B2 | * | 6/2006 | Okada ....................... 323/285 |
| 2007/0052398 | A1 | * | 3/2007 | Hasegawa et al. ............ 323/282 |
| 2007/0216387 | A1 | * | 9/2007 | Matsuo et al. ............... 323/282 |
| 2008/0111529 | A1 | * | 5/2008 | Shah et al. .................. 323/283 |

FOREIGN PATENT DOCUMENTS

JP    2000-354365    12/2000

* cited by examiner

*Primary Examiner* — Adolf Berhane
*Assistant Examiner* — Emily Pham
(74) *Attorney, Agent, or Firm* — Cantor Colburn LLP

(57) ABSTRACT

Multiple switching transistors are provided in parallel. An output circuit includes an inductor, an output capacitor, and a rectifying device. A pulse modulator generates a pulse signal with the duty ratio adjusted such that the output voltage of a switching regulator approaches a predetermined target value. A driver distributes a pulse signal to the multiple switching transistors, and switches the multiple switching transistors to the ON state in a time divisional manner.

16 Claims, 10 Drawing Sheets

22

SWITCHING REGULATOR AND CONTROL CIRCUIT THEREOF

BACKGROUND OF THE INVENTION

1. Field of the Invention

The present invention relates to a step-down switching regulator.

2. Description of the Related Art

Step-down switching regulators are mounted on electronic apparatuses such as TVs, personal computers, etc. The switching regulator steps down the input power supply voltage, and supplies the voltage thus stepped down to other circuit blocks mounted on the electronic apparatus.

The step-down switching regulator includes a switching transistor, a rectifying device, an inductor, an output capacitor, and a control circuit which controls the ON/OFF operation of the switching transistor.

[Patent Document 1]
Japanese Patent Application Laid Open No. 2000-345365

1. The current which is to be supplied to a load is supplied via a switching transistor. Accordingly, an increase in the load leads to a problem, in that the switching transistor generates heat, which has a local or a widespread effect. In general, by increasing the switching frequency, the properties of the switching regulator such as the load response and so forth can be improved. However, in a case in which the heat generation by the switching transistor becomes a problem, there is a need to lower the switching frequency in the circuit design. This leads to limitations on the design of the switching regulator and the circuit set. Such a problem can also occur in step-up switching regulators.

2. The step-down switching regulator includes a switching transistor, a rectifying device, an inductor, an output capacitor, and a control circuit which controls the ON/OFF operation of the switching transistor. It is convenient that the circuit operation can be modified by modifying the topology of the circuit elements which are each provided in the form of an external component, such as a switching transistor, rectifying device, while using the same control circuit.

SUMMARY OF THE INVENTION

The present invention has been made in order to solve such a problem. Accordingly, it is a general purpose of an embodiment of the present invention to provide a switching regulator having the advantage of reduced heat generation. Also, it is another general purpose of an embodiment thereof to provide a control circuit with improved versatility which is capable of switching the mode between a single-channel output mode and a multi-channel output mode.

1. An embodiment of the present invention relates to a switching regulator which steps down or boosts an input voltage applied to an input terminal, and which outputs an output voltage stabilized to a predetermined target value via an output terminal. The switching regulator includes: multiple switching transistors provided in parallel; an output circuit including an inductor, an output capacitor, and a rectifying device; a pulse modulator which generates a pulse signal with a duty ratio controlled such that the output voltage of the switching regulator approaches a predetermined target value; and a driver which distributes the pulse signal to the multiple switching transistors, and which switches the multiple switching transistors in a time divisional manner.

With such an embodiment, a pulse signal is distributed to the multiple switching transistors so as to drive these switching transistors in a time divisional manner. Thus, such an embodiment prevents a continuous flow of current at each switching transistor. As a result, this reduces heat generated by these switching transistors.

Also, the driver may divide in frequency the pulse signal, and may distribute multiple pulse signals thus divided to the multiple switching transistors.

Also, the driver may be configured so as to allow the mode to be switched between an alternative mode in which the multiple switching transistors are switched to the ON state in a time divisional manner and a normal mode in which the multiple switching transistors are driven according to a single pulse signal.

Also, the multiple switching transistors may have approximately the same device size. By designing the multiple switching transistors with the same size, such an arrangement suppresses fluctuation in their load driving performance that occurs due to the time-sharing driving operation.

Also, the driver may distribute the multiple pulse signals thus divided, such that the multiple switching transistors are sequentially switched to the ON state.

Also, the rectifying device may be a single synchronous rectifying transistor. Also, the driver may switch the synchronous rectifying transistor to the ON state with each cycle of the pulse signal.

Also, the rectifying device may be a diode.

Also, the switching regulator may be a step-down switching regulator. Also, each of the multiple switching transistors may be a P-channel MOSFET.

Another embodiment of the present invention relates to a control circuit for the above-described switching regulator. The control circuit includes the aforementioned pulse modulator and driver monolithically integrated on a single semiconductor substrate, and controls ON/OFF operations of the multiple switching transistors.

2. Yet another embodiment of the present invention relates to a control circuit for a switching regulator. The control circuit includes: a first input terminal which allows a first feedback voltage that corresponds to the output voltage of a first channel to be fed back; a second input terminal which allows a second feedback voltage that corresponds to the output voltage of second channel to be fed back; a first error amplifier which amplifies the difference between the first feedback voltage and a predetermined reference voltage; a second error amplifier which amplifies the difference between the second feedback voltage and a predetermined reference voltage; a first pulse modulation comparator which compares a first error voltage output from the first error amplifier with a predetermined periodic voltage; a second pulse modulation comparator which compares a second error voltage output from the second error amplifier with a predetermined periodic voltage; a first driver which amplifies a first pulse signal output from the first pulse modulation comparator; and second driver which amplifies a second pulse signal output from the second pulse modulation comparator. In a case in which a two-channel diode-rectifying step-down switching regulator is to be controlled, the control circuit is set to a first mode. On the other hand, in a case in which a single-channel synchronous-rectifying step-down switching regulator is to be controlled, the control circuit is set to a second mode. In the first mode, the output signals of the first and second drivers are respectively supplied to high-side transistors of the first and second channels of the diode-rectifying step-down switching regulator. On the other hand, in the second mode, the output signal of the first driver is supplied to a high-side transistor of the single-channel synchronous-rectifying step-down switching regulator, and the output signal of the second driver, the duty ratio of which is set to a value that corresponds to the first feedback voltage, is supplied to a low-side transistor of the single-channel synchronous-rectifying step-down switching regulator.

Such an embodiment allows the driving mode to be switched between the single-channel output driving mode and the multi-channel output driving mode using a single control circuit.

Also, in the first mode, the second pulse modulation comparator may compare the second error voltage output from the second error amplifier with a predetermined periodic voltage. Also, in the second mode, the second pulse modulation comparator may compare a voltage that corresponds to the first error voltage output from the first error amplifier with a predetermined periodic voltage.

With such an arrangement, the duty ratio of the output signal of the second driver can be set to a value that corresponds to the first feedback voltage.

Also, in the second mode, the second pulse modulation comparator may compare the voltage obtained by level-shifting the first error voltage with the periodic voltage.

By generating the voltage that corresponds to the first error voltage by level-shifting the first error voltage, a dead time can be set for the high-side transistor and the low-side transistor.

Also, a control circuit according to an embodiment may further include a switch and a resistor provided in series between the output terminal of the first error amplifier and the output terminal of the second error amplifier. Also, the switch may be switched to the OFF state in the first mode, and may be switched to the ON state in the second mode.

With such an arrangement, when the switch is in the ON state, current flows through the resistor, thereby generating a voltage drop across the resistor. Accordingly, the first error voltage output from the first error amplifier can be level-shifted by the voltage drop, thereby adjusting the length of the dead time according to the resistance of the resistor.

Also, in the first mode, the second driver may amplify the second pulse signal output from the second pulse modulation comparator. Also, in the second mode, the second driver may amplify a signal having a duty ratio that corresponds to the first pulse signal output from the first pulse modulation comparator.

Also, a control circuit according to an embodiment may further include: a third input terminal which allows a third feedback voltage that corresponds to the output voltage of a third channel to be fed back; a third error amplifier which amplifies the difference between the third feedback voltage and a predetermined reference voltage; a third pulse modulation comparator which compares a third error voltage output from the third error amplifier with a predetermined periodic voltage; and a third driver which amplifies a third pulse signal output from the third pulse modulation comparator. Also, in a case in which a 3-channel diode-rectifying step-down switching regulator is to be controlled, the control circuit may be set to a third mode. Also, in the third mode, the output signals of the first through third drivers may respectively be supplied to high-side transistors of the first through third channels of the diode-rectifying step-down switching regulator.

Also, in a case in which a synchronous-rectifying step-down switching regulator including two high-side transistors connected in parallel is to be controlled, and complementary ON/OFF operations are to be performed for the two high-side transistors, the control circuit may be set to a fourth mode. Also, in the fourth mode, the first pulse signal may be divided, the pulse signals thus divided may be distributed to the first and third drivers, the output signals of the first and third drivers may be supplied to the two high-side transistors, and the output signal of the second driver, the duty ratio of which is set to a value that corresponds to the first feedback voltage, may be supplied to a low-side transistor of the single-channel synchronous-rectifying step-down switching regulator.

Also, in a case in which a synchronous-rectifying step-down switching regulator including two high-side transistors connected in parallel is to be controlled, and the two high-side transistors are to be switched to the ON state at the same time, the control circuit may be set to a fifth mode. Also, in the fifth mode, the first pulse signal may be distributed to the first and third drivers, the output signals of the first and third drivers may be supplied to the two high-side transistors, and the output signal of the second driver, the duty ratio of which is set to a value that corresponds to the first feedback voltage, may be supplied to a low-side transistor of the single-channel synchronous-rectifying step-down switching regulator.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

First Embodiment

Figure 1:
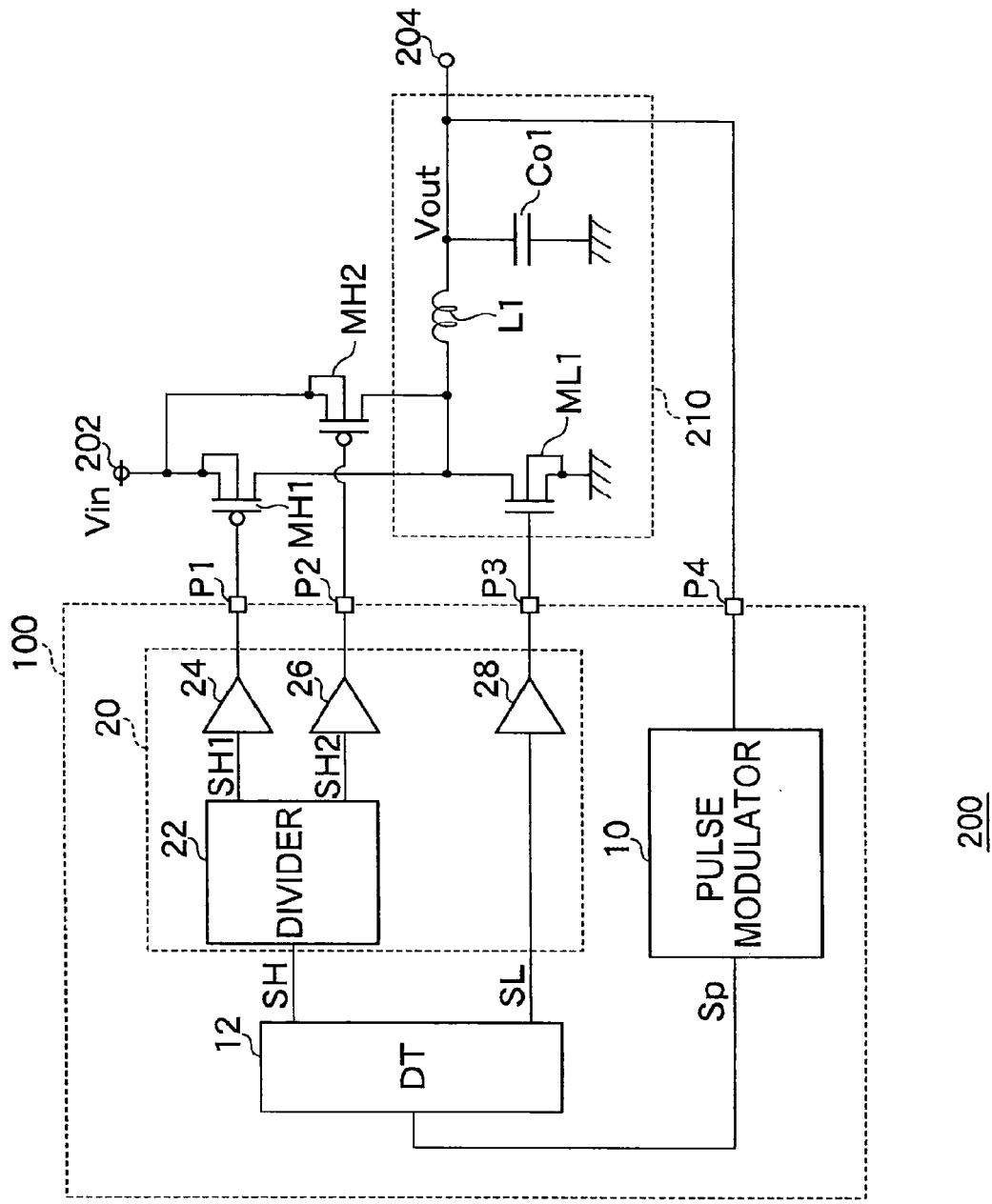
FIG. 1 is a circuit diagram which shows a configuration a step-down switching regulator according to a first embodiment.

FIG. 1 is a circuit diagram which shows a configuration of a step-down switching regulator 200 according to a first embodiment. The switching regulator 200 is a synchronous-rectifying step-down switching regulator which steps down an input voltage Vin applied to an input terminal 202, and outputs an output voltage Vout, which has been stabilized at a predetermined target value, via an output terminal 204.

The switching regulator 200 includes a first high-side transistor MH1, a second high-side transistor MH2, an output circuit 210, and a control circuit 100. The output circuit 210 includes a low-side transistor ML1, an inductor L1, and an output capacitor Col.

The switching regulator 200 shown in FIG. 1 includes multiple switching transistors, i.e., the first high-side transistor MH1 and the second high-side transistor MH2. The first high-side transistor MH1 and the second high-side transistor MH2 are connected in parallel, with the source terminals thereof connected to each other so as to form a common source terminal, and with the drain terminals thereof connected to each other so as to form a common drain terminal. The common source terminal thus connected is connected to the input terminal 202. The multiple switching transistors MH1 and MH2 are p-channel MOSFETs of the same type. The multiple switching transistors MH1 and MH2 preferably have approximately the same device size.

The low-side transistor ML1 is an N-channel MOSFET, and is provided for synchronous rectification. The source of the low-side transistor ML1 is grounded, and the drain thereof is connected to the drains of the multiple switching transistors (MH1, MH2). That is to say, the low-side transistor ML1 is connected in series with the multiple switching transistors (MH1, MH2) between the input terminal 202 and the ground terminal (fixed voltage terminal).

The inductor L1 is provided between a connection node N1 that connects the multiple switching transistors MH1 and MH2 and the low-side transistor ML1 and the output terminal 204. The output capacitor Col is provided between the output terminal 204 and the ground terminal.

By alternately switching the ON/OFF state of at least one of the switching transistors MH1 and MH2 and the ON/OFF state of the low-side transistor ML1, the output voltage Vout is generated at the output terminal 204 according to the ON period of the switching transistors MH1 and MH2.

The control circuit 100 includes a pulse generator 10, a dead time generating unit 12, and a driver 20, which are monolithically integrated on a single semiconductor substrate. The output voltage is fed back via the feedback terminal P4 as a feedback signal. The pulse generator 10 generates a pulse signal Sp having a duty ratio which is controlled such that the output voltage Vout of the switching regulator 200 thus fed back as a feedback signal approaches a predetermined target value. A known pulse width modulator or pulse frequency modulator can be employed as the pulse modulator 10, regardless of whether the circuit configuration is provided in the form of an analog circuit or a digital circuit. Also, the pulse modulator 10 may employ either a voltage mode method or a current mode method.

The dead time generating unit 12 receives a pulse signal Sp, sets a dead time so as to prevent the high-side transistors MH1 and MH2 and the low-side transistor ML1 from being in the ON state at the same time, and outputs a pulse signal SH for the high-side transistor and a pulse signal SL for the low-side transistor.

The driver 20 includes a divider 22, a first high-side driver 24, a second high-side driver 26, and a low-side driver 28. The low-side driver 28 of the driver 20 receives the pulse signal SL for the low-side transistor, and supplies the pulse signal SL to the gate of the low-side transistor ML1 via a third switching terminal P3. That is to say, the driver 20 switches the transistor ML1 for synchronous rectification to the ON state for each cycle of the pulse signal Sp, according to the OFF period of the pulse signal Sp.

Furthermore, the driver 20 distributes the pulse signal SH for the high-side transistors to the multiple switching transistors MH1 and MH2, and switches the multiple switching transistors MH1 and MH2 in a time divisional manner.

The divider 22 divides in frequency the pulse signal SH for the high-side transistors. The driver 20 distributes the multiple pulse signals SH1 and SH2 thus divided to the multiple switching transistors MH1 and MH2. One of the pulse signals thus divided, pulse signal SH1, is supplied to the first high-side driver 24, and the other pulse signal, pulse signal SH2, is supplied to the second high-side driver 26. The first high-side driver 24 and the second high-side driver 26 drive the first high-side transistor MH1 and the second high-side transistor MH2 via the first switching terminal P1 and the second switching terminal P2, respectively.

For example, the driver 20 distributes the multiple pulse signals SH1 and SH2 thus divided, so as to sequentially or alternately switch the multiple switching transistors MH1 and MH2 to the ON state.

Figure 2:
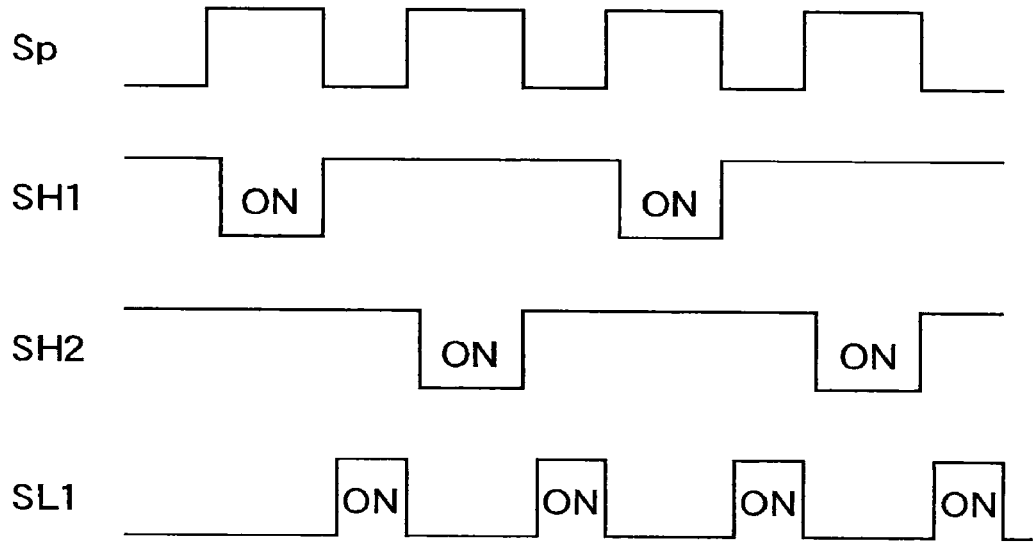
FIG. 2 is a time chart which shows the operation of the switching regulator shown in FIG. 1.

The above is the configuration of the switching regulator 200. Next, description will be made regarding the operation of the switching regulator 200. FIG. 2 is a time chart which shows the operation of the switching regulator shown in FIG. 1. The driver 20 assigns the high-level period of the pulse signal Sp to the ON period of the multiple switching transistors (high-side transistors MH1 and MH2), and assigns the low-level period to the ON period of the low-side transistor ML1.

The pulse signal Sp is divided in half by the driver 20, and the pulse signals SH1 and SH2 thus divided are supplied to the first high-side transistor MH1 and the second high-side transistor MH2, respectively. As a result, the two high-side transistors MH1 and MH2 are alternately switched to the ON state. That is to say, the switching regulator 200 repeatedly performs an operation in which the first high-side transistor MH1 is switched to the ON state, the low-side transistor ML1 is switched to the ON state, the second high-side transistor MH2 is switched to the ON state, and the low-side transistor ML1 is switched to the ON state.

As a result, such an arrangement provides the advantage of reducing a continuous flow of the pulse current flowing through the first high-side transistor MH1 and the second high-side transistor MH2, as compared with an arrangement including a single high-side transistor.

In an experiment, under conditions in which the switching regulator 200 shown in FIG. 1 was operated at Vin=7 V, Vout=3.3 V, and a switching frequency of 1 MHz, the temperature around the high-side transistors MH1 and MH2 was measured, and was found to be 63° C. By comparison, an arrangement employing a single high-side transistor was operated under the same conditions, and the temperature around the single high-side transistor was found to be 74° C. That is to say, it has been confirmed that the temperature is reduced by nearly 10° C.

As described above, the switching regulator 200 according to the first embodiment has the advantage of reduced heat generation. The reduced heat generation allows the switching frequency to be raised as compared with conventional arrangements. Such an arrangement improves the stability of the output voltage Vout.

The driver 20 preferably has a configuration which is capable of switching the driving mode between an alternative mode in which the multiple switching transistors MH1 and MH2 are switched to the ON state in a time divisional manner and a normal mode in which the multiple switching transistors MH1 and MH2 are driven according to the same pulse signal. In other words, the driver 20 can be configured such that SH1=SH2=SH. Such an arrangement is capable of switching the first high-side transistor MH1 and the second high-side transistor MH2 at the same timing, thereby providing the same operation mode as that of conventional switching regulators including a single high-side transistor.

Also, by providing the normal mode, such an arrangement is capable of driving the switching transistor even in a case in which only a single transistor (either the high-side transistor MH1 or MH2) is provided as an external component to the control circuit 100.

That is to say, by providing a function of switching the driving mode between the normal mode and the alternative mode, such an arrangement provides the control circuit 100 with improved versatility.

Figure 3:
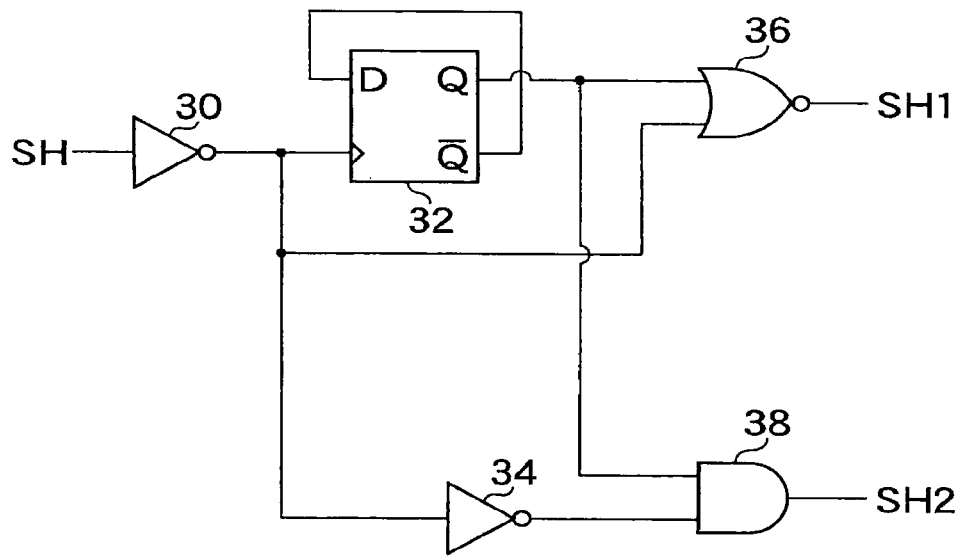
FIG. 3 is a circuit diagram which shows part of an example configuration of a divider included in a driver.

FIG. 3 is a circuit diagram which shows part of an example configuration of the divider 22 of the driver 20. An inverter 30 inverts the pulse signal Sp for the high-side transistors. Via the clock terminal, a D flip-flop 32 receives the pulse signal SH inverted by the inverter 30. The inverting terminal *Q of the D flip-flop 32 is connected to the input terminal D. The pulse signal SH for the high-side transistors is divided in half by the D flip-flop 32.

A NOR gate 36 outputs the negative OR of the output of the inverter 30 and the output of the D flip-flop as the pulse signal SH1. An inverter 34 inverts the output of the inverter 30. The AND gate 38 outputs the AND of the output of the inverter 34 and the output of the D flip-flop 32 as the pulse signal SH2. It should be noted that the configuration of the divider 22 shown in FIG. 3 has been described for exemplary purposes only, and the present invention is not restricted to such an arrangement.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

Description has been made in the embodiment regarding a synchronous-rectification switching regulator as an example. However, the present invention is not restricted to such an arrangement. For example, the switching regulator may include a rectifying diode, instead of the low-side transistor ML1.

Description has been made in the embodiment regarding an arrangement including two high-side transistors. Also, an arrangement may be made including three or more high-side transistors. With such an arrangement, the thermal dispersion effects become more marked.

Also, description has been made in the embodiment regarding an arrangement in which the pulse signal Sp is divided in half so as to alternately switch the first high-side transistor MH1 and the second high-side transistor MH2 to the ON state. However, the present invention is not restricted to such an arrangement.

Stated in general terms, an arrangement may be made in which, with n (which is an integer) consecutive pulses as one pulse set, two pulse sets are generated, and these two sets are respectively distributed to the first high-side transistors MH1 and MH2. That is to say, the time chart in FIG. 1 shows an arrangement in which n=1. Also, an arrangement may be made in which n=2 or more.

Description has been made in the embodiment regarding an arrangement in which each of the first high-side transistor MH1 and the second high-side transistor MH2 is a P-channel MOSFET. Also, each of these high-side transistors may be an N-channel MOSFET.

Second Embodiment

Figure 4:
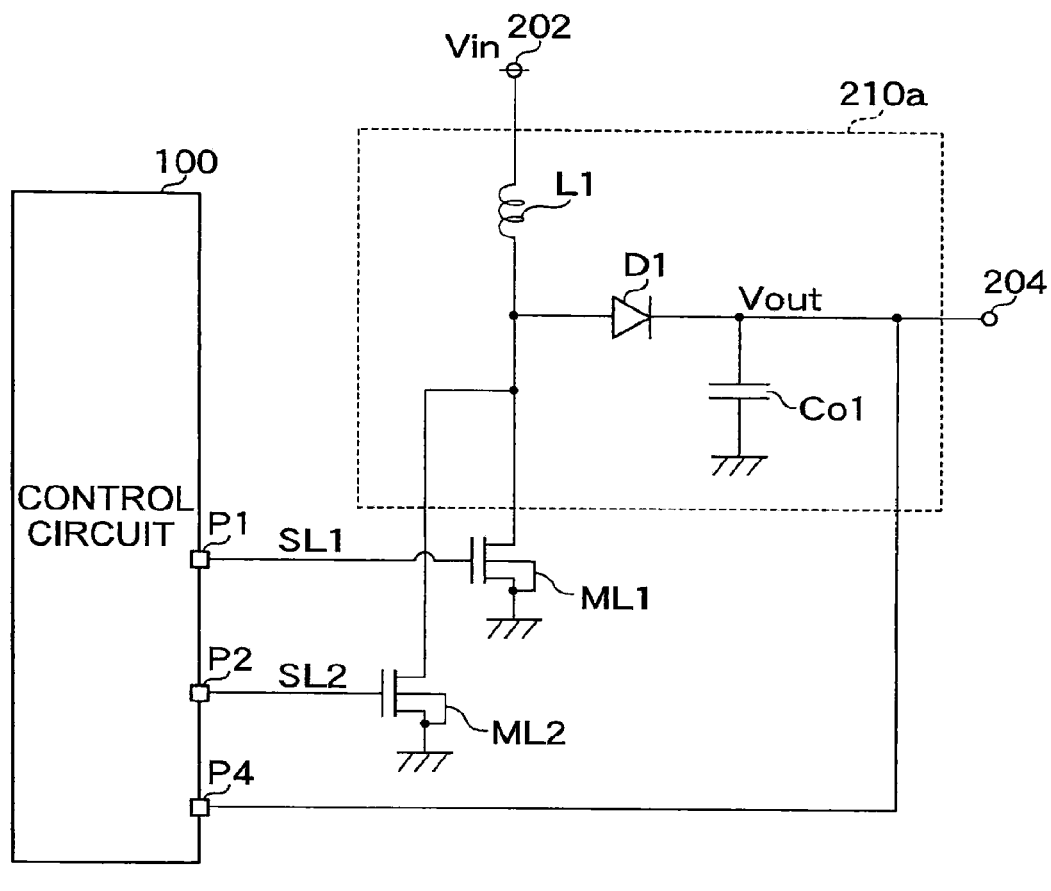
FIG. 4 is a circuit diagram which shows a configuration of a step-up switching regulator according to a second embodiment.

Although description has been made in the embodiment regarding a step-down switching regulator, the present invention can also be applied to a step-up switching regulator. FIG. 4 is a circuit diagram which shows a configuration of a step-up switching regulator 200a according to a second embodiment. The switching regulator 200a includes multiple low-side transistors ML1 and ML2, a control circuit 100, and an output circuit 210a. The topology of the output circuit 210 is known, and accordingly, description thereof will be omitted. A rectifying transistor may be employed, instead of the rectifying diode D1.

The switching regulator 200a shown in FIG. 4 includes the multiple switching transistors ML1 and ML2. The control circuit 100 drives the multiple switching transistors ML1 and ML2 in a time divisional manner. The switching regulator 200a shown in FIG. 4 provides the advantage of reduced heat generation by the switching transistors ML1 and ML2 in the same way as with the step-down switching regulator 200 shown in FIG. 1.

In the switching regulator shown in FIG. 1 or FIG. 4, the switching transistors may be included within the control circuit 100 in the form of built-in components.

Third Embodiment

Figure 5:
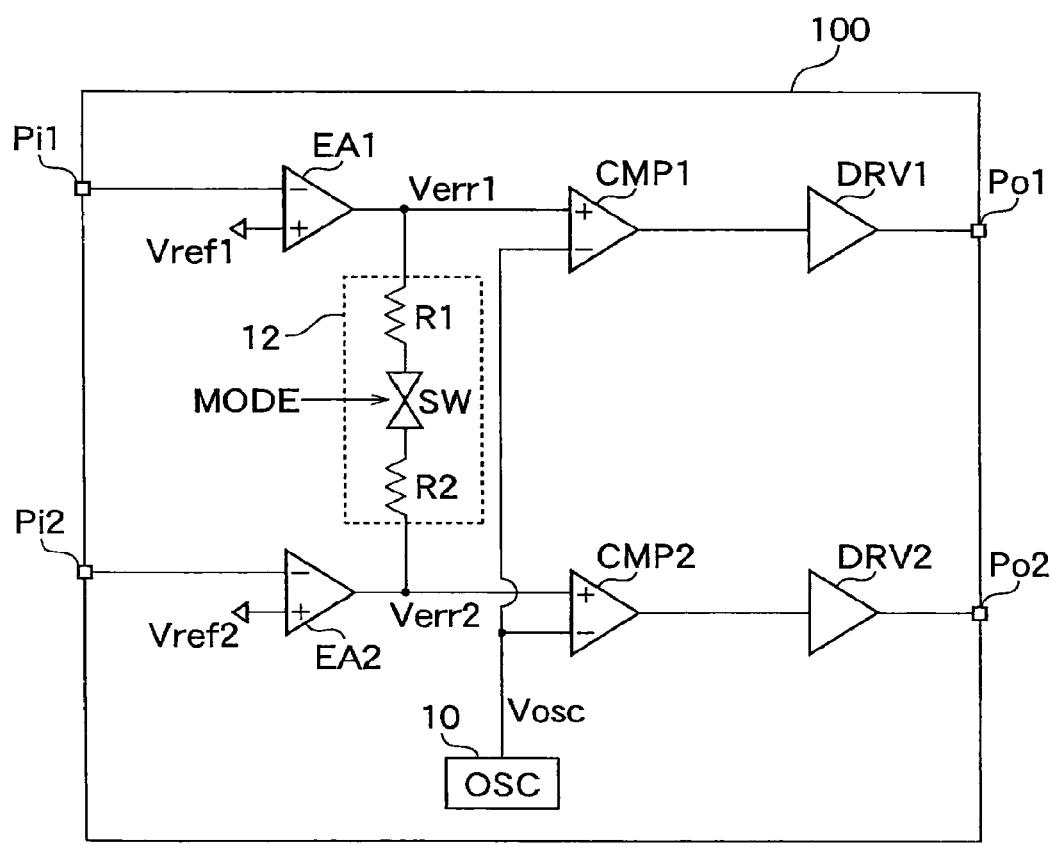
FIG. 5 is a circuit diagram which shows a configuration of a control circuit for a step-down switching regulator according to a third embodiment.

FIG. 5 is a circuit diagram which shows a configuration of a control circuit 100 for a step-down switching regulator according to a third embodiment. The control circuit 100 is a function IC monolithically integrated on a single semiconductor substrate, including a first input terminal Pi1, a second input terminal Pi2, a first output terminal Pot, and a second output terminal Po2.

The control circuit 100 is configured according to the layout of the peripheral circuit devices, such that it is capable of switching the driving mode between a first mode in which a two-channel diode-rectifying step-down switching regulator is controlled and a second mode in which a single-channel synchronous-rectifying step-down switching regulator is controlled.

The first input terminal P11 is provided in order to receive a first feedback voltage Vfb1, which corresponds to the first channel output voltage Vout1, as a feedback signal. The second input terminal Pi2 is provided in order to receive a second feedback voltage Vfb2, which corresponds to the second channel output voltage Vout2, as a feedback signal. In a case in which the control circuit is used in the single-channel mode, the output voltage Vout is fed back as a feedback signal to only the first input terminal Pi1. Via the first output terminal Po1 and the second output terminal Po2, a control signal is output for controlling the ON/OFF operation of each externally connected switching transistor.

A first error amplifier EA1 amplifies the difference between the first feedback voltage Vfb1 and a predetermined reference voltage Vref, and generates a first error voltage Verr1. In the same way, a second error amplifier EA2 amplifies the difference between the second feedback voltage Vfb2 and the predetermined reference voltage Vref, and generates a second error voltage Verr2.

An oscillator 10 generates a periodic voltage Vosc with a predetermined frequency in the shape of a triangular waveform or a sawtooth waveform.

A first pulse modulation comparator (which will be referred to as the "first comparator" hereafter) CMP1 compares the first error voltage Verr1 output from the first error amplifier EA1 with the periodic voltage Vosc. The first comparator CMP1 outputs a first pulse signal Spwm1, the level of which transits each point of intersection of these two voltage curves. The first pulse signal Spwm1 is subjected to pulse width modulation, and the duty ratio thereof is adjusted using a feedback operation such that the first feedback voltage Vfb1 matches the reference voltage Vref.

In the same way, the second pulse modulation comparator (which will be referred to as the "second comparator" hereafter) CMP2 compares the second error voltage Verr2 output from the second error amplifier EA2 with the periodic voltage Vosc, and generates a second pulse signal Spwm2.

A first driver DRV1 amplifies the first pulse signal Spwm1 output from the first comparator CMP1. The second driver DRV2 amplifies the second pulse signal Spwm2 output from the second comparator CMP2.

When a two-channel diode-rectifying step-down switching regulator is to be controlled, the control circuit 100 is set to the first mode, and when a single-channel synchronous-rectifying step-down switching regulator is to be controlled, the control circuit 100 is set to the second mode. The operation for switching between the first mode and the second mode is performed according to a signal applied to an unshown control terminal.

Figures 6A, 6B:
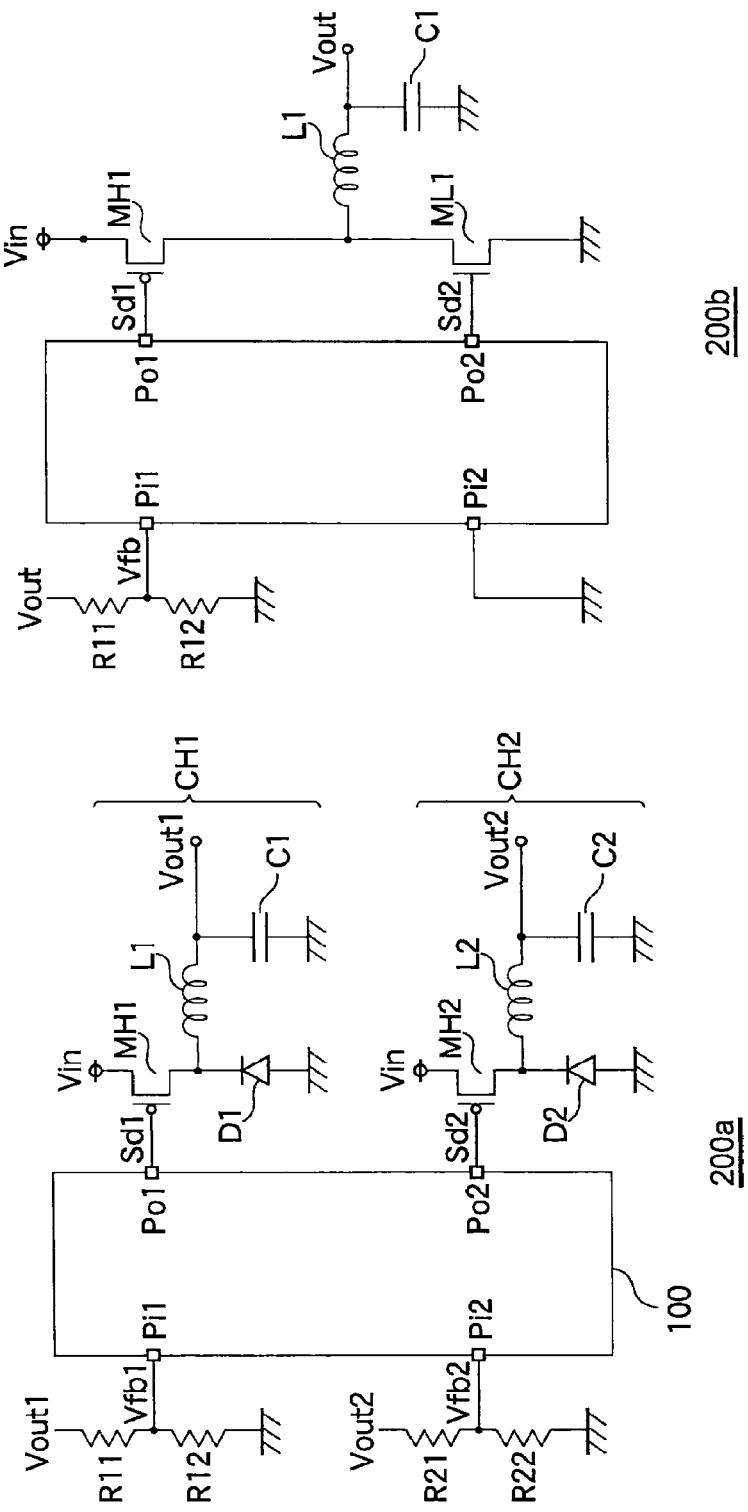
FIGS. 6A and 6B are circuit diagrams which shows the configurations of switching regulators including the control circuit shown in FIG. 5.

FIGS. 6A and 6B are circuit diagrams which show the configurations of switching regulators 200a and 200b including the control circuit 100 shown in FIG. 5. FIG. 6A shows the configuration of the 2-channel diode-rectifying switching regulator 200a. FIG. 6B shows the configuration of the single-channel synchronous-rectifying switching regulator 200b.

Description will be made regarding the configuration shown in FIG. 6A. A first channel CH1 has a configuration including a first high-side transistor MH1, a first rectifying diode D1, a first inductor L1, and a first output capacitor C1. A second channel CH2 has a configuration including a second high-side transistor MH2, a second rectifying diode D2, a second inductor L2, and a second output capacitor C2. Each channel has the same circuit topology as that of a switching regulator employing a conventional synchronous rectifying method.

In a case as shown in FIG. 6A, the control circuit 100 is set to the first mode. The voltage obtained by dividing the output voltage Vout1 of the first channel CH1 using resistors R11 and R12 is fed back to the first input terminal Pi1 as a feedback voltage. The voltage obtained by dividing the output voltage Vout2 of the second channel CH2 using resistors R21 and R22 is fed back to the second input terminal Pi2 as a feedback voltage.

In the first mode, the output signals Sd1 and Sd2 of the first driver DRV1 and the second driver DRV2 are output via the first output terminal Po1 and the second output terminal Po2, respectively. These output signals Sd1 and Sd2 are supplied to the control terminals (gates) of the high-side transistors MH1 and MH2 of the first channel CH1 and the second channel CH2, respectively.

In the first mode, a discrete feedback function is provided to each of the first channel and the second channel, thereby stabilizing the two output voltages Vout1 and Vout2 to their own target values.

Description will be made regarding the configuration shown in FIG. 6B. The switching regulator 200b is a single-channel synchronous-rectifying switching regulator having a configuration including a first high-side transistor MH1, a first low-side transistor ML1, a first inductor L1, and a first output capacitor C1. The switching regulator 200b has a conventional circuit topology.

The voltage obtained by dividing the output voltage Vout using resistors R11 and R12 is input to the first input terminal Pi1 of the control circuit 100 as a feedback voltage Vfb.

In the second mode, the output signal Sd1 of the first driver DRV1 is supplied to the first high-side transistor MH1 of the switching regulator 200b.

In the second mode, the feedback loop using the first error amplifier EA1 is disabled. The output signal Sd2 of the second driver DRV2 is set such that the duty ratio thereof corresponds to the first feedback voltage Vfb1, and the output signal Sd2 is supplied to the first low-side transistor ML1 of the switching regulator 200b.

Returning to FIG. 5, in the second mode, the control circuit 100 sets the duty ratio of the first pulse signal Spwm1 and the duty radio of the second pulse signal Spwm2 based upon the feedback voltage Vfb input to the first input terminal Pi1. As a result, the first high-side transistor MH1 and the second high-side transistor MH2 shown in FIG. 6B repeatedly perform complementary alternating ON/OFF operations of the first high-side transistor MH1 and the second high-side transistor MH2 so as to stabilize the output voltage Vout to a target value that corresponds to the reference voltage Vref1.

The above is the overall configuration and functions of the control circuit 100.

The function of the second comparator CMP2 is switched according to the switching of the mode between the first mode and the second mode. In the first mode, the second comparator CMP2 compares the second error voltage Verr output from the second error amplifier EA2 with the periodic voltage Vosc.

On the other hand, in the second mode, the voltage Verr1' which corresponds to the first error voltage Verr1 output from the first error amplifier EA1 is compared with the periodic voltage Vosc. Specifically, the voltage (Verr1+ΔV) obtained by level-shifting the first error voltage Verr1 is compared with the periodic voltage Vosc. In order to provide such a function, the control circuit 100 includes a level shifter 12 provided between the output terminal of the first error amplifier EA1 and the output terminal of the second error amplifier EA2.

The level shifter 12 receives a mode control signal MODE1 as an input signal for switching the mode. In the first mode, the level shifter 12 is disabled. In this state, the error voltages Verr1 and Verr2 generated by the error amplifiers EA1 and EA2 are output to the downstream comparators CMP1 and COMP2, respectively.

In the second mode, the level shifter 12 is enabled. In this state, the level shifter 12 generates the voltage Verr1+ΔV by level-shifting the first error voltage Verr1, and outputs the voltage thus level-shifted to the second comparator CMP2.

For example, the level shifter 12 includes a first resistor R1, a second resistor R2, and a switch (transfer gate) SW, provided in series between the output terminal of the first error amplifier EA1 and the output terminal of the second error amplifier EA2.

The switch SW receives the mode control signal MODE1 as an input signal. In the first mode, the switch SW is switched to the OFF state. In the second mode, the switch SW is switched to the ON state. Because the switch SW is switched to the ON state in the second mode, current flows through the resistors R1 and R2, thereby generating a voltage drop ΔV. Thus, the first error voltage Verr1 output from the first error amplifier EA1 is level-shifted by the voltage drop ΔV.

Figure 7:
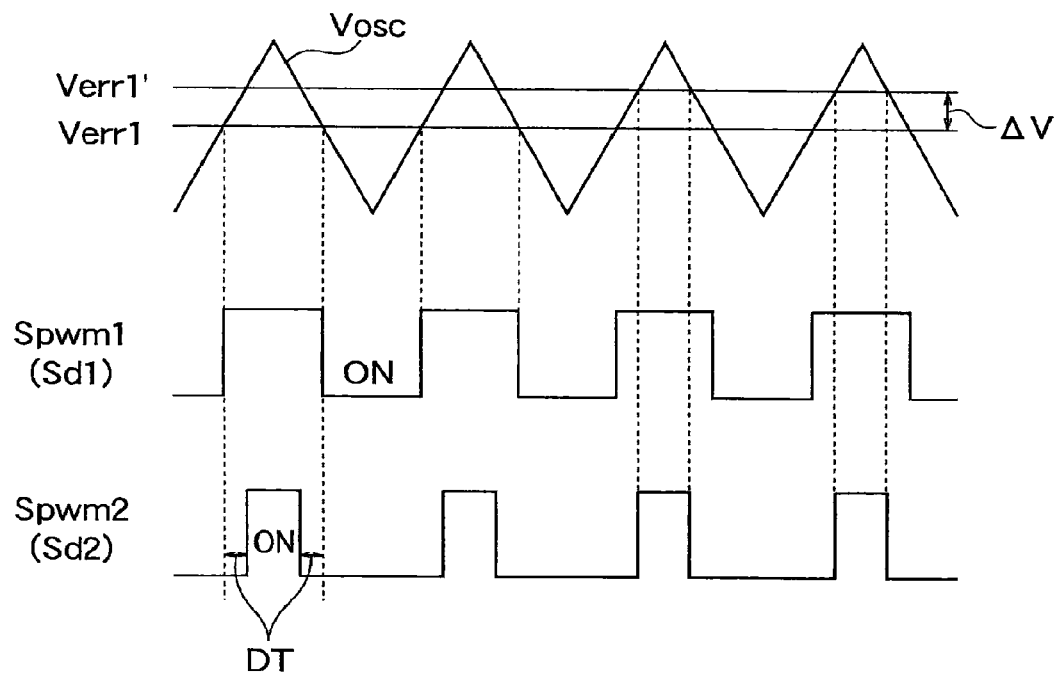
FIG. 7 is a time chart which shows the operation state of the control circuit shown in FIG. 5 in the second mode.

FIG. 7 is a time chart which shows the operation state of the control circuit 100 shown in FIG. 5 in the second mode. When Vosc is greater than Verr1, the first pulse signal Spwm1 is in the high-level state, and when Vosc is smaller than Verr1, the first pulse signal Spwm1 is in the low-level state. When Vosc is greater than Verr2, the second pulse signal Spwm2 is in the high-level state, and when Vosc is smaller than Verr2, the second pulse signal Spwm2 is in the low-level state. In the switching regulator 200b shown in FIG. 6B, when the first pulse signal Spwm1 is in the low-level state, the first high-side transistor MH1 is in the ON state, and when the second pulse signal Spwm2 is in the high-level state, the first low-side transistor ML1 is in the ON state.

The error voltage Verr' is the voltage obtained by level-shifting the first error voltage Verr1. Accordingly, the high-level period of the second pulse signal Spwm2 is smaller than that of the first pulse signal Spwm1. Thus, the dead time DT can be set according to the level shift amount ΔV generated by the level shifter 12. Such an arrangement shown in FIG. 5 allows the length of the dead time DT to be set according to the resistances of the resistors R1 and R2.

The above is the configuration and operation of the control circuit 100. The control circuit 100 is capable of switching the mode between the single channel output mode and the multi-channel output mode, thereby improving the versatility of the control circuit 100.

Fourth Embodiment

Figure 8:
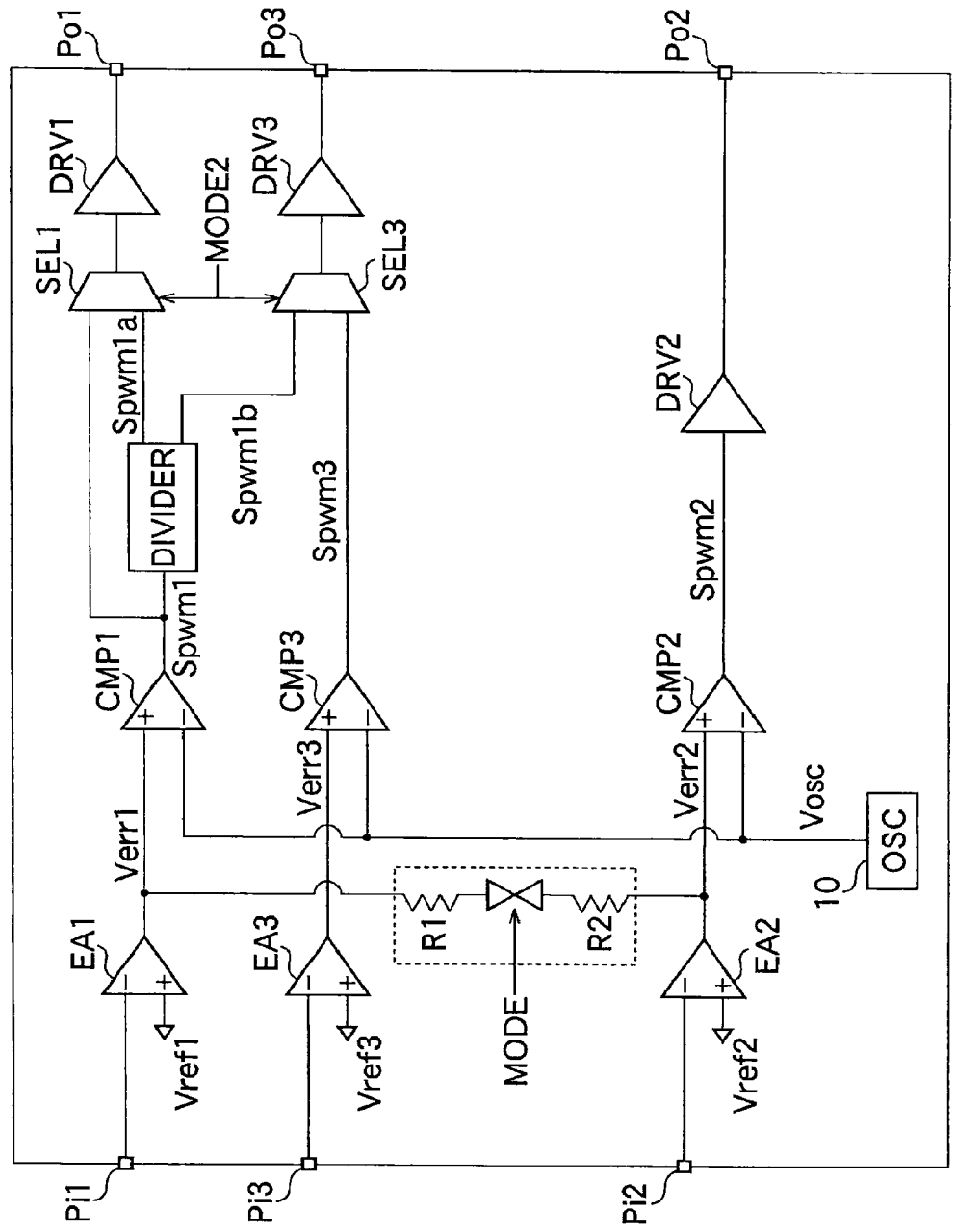
FIG. 8 is a circuit diagram which shows a configuration of a control circuit for a step-down switching regulator according to a fourth embodiment.

FIG. 8 is a circuit diagram which shows a configuration of a control circuit 100a for a step-down switching regulator according to a fourth embodiment. The control circuit 100a includes a third input terminal Pi3 and a third output terminal Po3, in addition to the configuration of the control circuit 100 shown in FIG. 5. Description will be made below mainly regarding the points of difference from the configuration shown in FIG. 5.

The control circuit 100a is configured such that the mode can be switched between a third mode in which a 3-channel diode-rectifying step-down switching regulator is controlled, and a fourth mode and a fifth mode in which a single-channel synchronous-rectifying step-down switching regulator is controlled.

The third input terminal Pi3 is provided, which allows a third feedback voltage Vfb3 that corresponds to a third-channel output voltage Vout3 to be fed back as a feedback voltage. In a case in which the control circuit 100a is used in the single-channel mode, the output voltage Vout is fed back as a feedback voltage only to the first input terminal Pi1. Via the first output terminal Po1 through the third output terminal Po3, control signals are output so as to control the ON/OFF operations of the switching transistors connected to external circuits.

The third error amplifier EA3 amplifies the difference between the third feedback voltage Vfb3 and the reference voltage Vref, and generates a third error voltage Verr3.

A third comparator CMP3 compares the third error voltage Verr3 output from the third error amplifier EA3 with the periodic voltage Vosc. The third comparator CMP3 outputs a third pulse signal Spwm3, the level of which transits each point of intersection of these two voltage curves.

A third driver DRV3 amplifies the third pulse signal Spwm3 output from the third comparator CMP3.

When a 2-channel diode-rectifying step-down switching regulator is to be controlled, the control circuit 100a is set to the third mode, and when a single-channel synchronous-rectifying step-down switching regulator is to be controlled, the control circuit 100a is set to either the fourth mode or the fifth mode. The operation for switching between the third mode through fifth mode is performed according to a signal applied to an unshown control terminal.

Figure 9B:
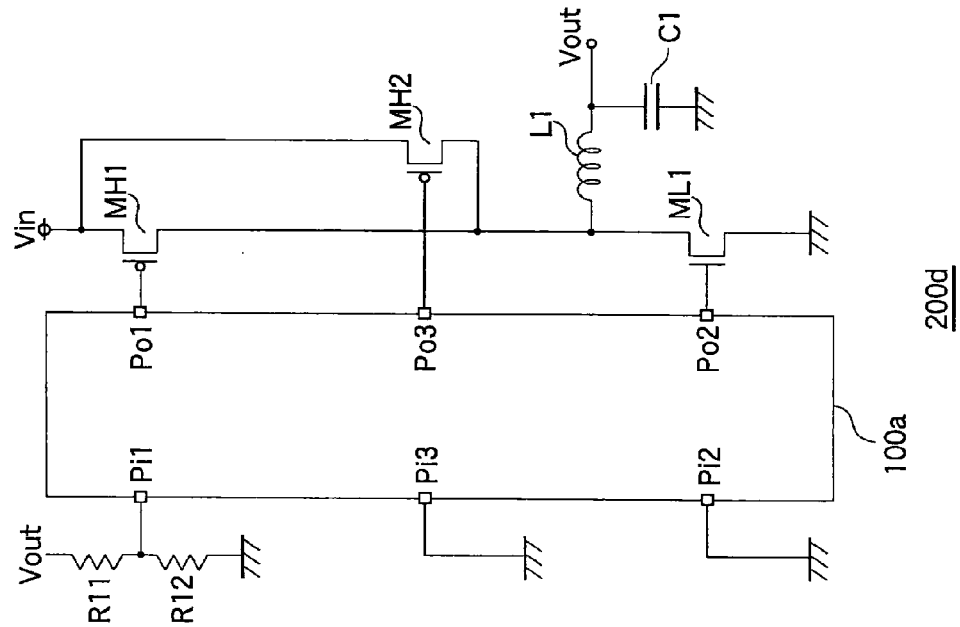
FIGS. 9A and 9B are circuit diagram which shows the configurations of switching regulators including the control circuit shown in FIG. 8.
Figure 9A:
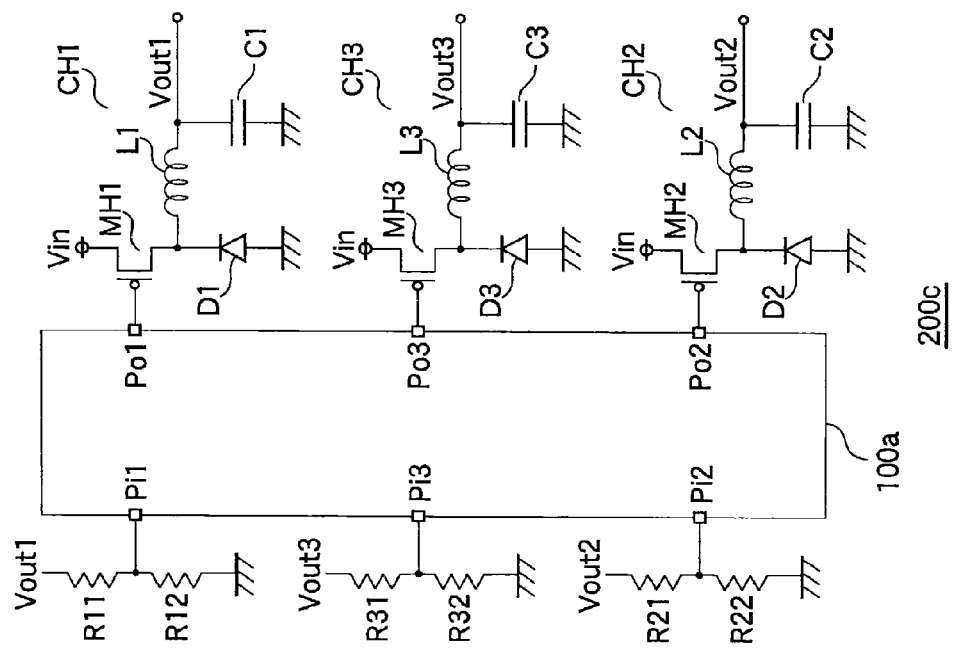

FIGS. 9A and 9B are circuit diagrams which show the configurations of switching regulators 200c and 200d each of which includes the control circuit 100a shown in FIG. 8. FIG. 9A shows the configuration of the 3-channel diode-rectifying switching regulator 200c. FIG. 9B shows the configuration of the single-channel synchronous-rectifying switching regulator 200d.

Description will be made regarding the configuration shown in FIG. 9A. The third channel CH3 has a configuration including a third high-side transistor MH3, a third rectifying diode D3, a third inductor L3, and a third output capacitor C3.

In a case as shown in FIG. 9A, the control circuit 100a is set to the third mode. The voltage obtained by dividing the output voltage Vout3 of the third channel CH3 is fed back to the third input terminal Pi3 as the third feedback voltage Vfb3.

In the third mode, the output signals Sd1 through Sd3 of the first driver DRV1 through the third driver DRV3 are supplied to the gates of the high-side transistors MH1 through MH3 of the first channel CH1 through the third channel CH3.

In the third mode, a discrete feedback function is provided to each of the first channel CH1 through the third channel CH3 such that the three output voltages Vout1 through Vout3 are stabilized to their own target values.

Description will be made regarding the configuration shown in FIG. 9B. The switching regulator 200d is a single-channel synchronous-rectifying switching regulator including two high-side transistors MH1 and MH2 connected in parallel.

The voltage obtained by dividing the output voltage Vout using the resistors R11 and R12 is input to the first input terminal Pi1 as the feedback voltage Vfb. The second input terminal Pi2 and the third input terminal Pi3 are grounded.

In a case in which the switching regulator shown in FIG. 9B is to be controlled, the control circuit 100a is set to either the fourth mode or the fifth mode.

The fourth mode is a mode (alternative mode) in which complementary ON/OFF operations are performed for the two high-side transistors MH1 and MH2.

In the fourth mode, the feedback loop using the first error amplifier EA1 and the feedback loop using the third error amplifier EA3 are disabled. The duty ratio of the output signal Sd2 of the second driver DRV2 is set to a value that corresponds to the first feedback voltage Vfb1, and the output signal Sd2 thus set is supplied to the gate of the first low-side transistor ML1 of the switching regulator 200d. The operation is the same as that of the control circuit 100 shown in FIG. 5 in the second mode.

In the fourth mode, the first pulse signal Spwm1 is divided, and the signals thus divided are supplied to the first driver DRV1 and the third driver DRV3. The output signals Sd1 and Sd3 of the first driver DRV1 and the third driver DRV3 are supplied to the gates of the two high-side transistors MH1 and MH2.

Returning to FIG. 8, a divider 14 is provided downstream of the first comparator CMP1. The divider 14 divides the pulse signal Spwm1 for the high-side transistors. The pulse signals Spwm1a and Spwm1b thus divided are input to selectors SEL1 and SEL3, respectively.

The selector SEL1 selects either the pulse signal Spwm1a thus divided or the pulse signal Spwm1 that has not been subjected to the dividing processing, and outputs the signal thus selected to the first driver DRV1. The selector SEL3 selects either the pulse signal Spwm1b thus divided or the pulse signal Spwm3, and outputs the signal thus selected to the third driver DRV3.

The selectors SEL1 and SEL3 are switched according to a mode control signal MODE2. In the third mode, the selector SEL1 selects the first pulse signal Spwm1, and the selector SEL3 selects the third pulse signal Spwm3. In the fourth mode, the selector SEL1 selects the pulse signal Spwm1a, and the selector SEL3 selects the pulse signal Spwm1b.

Figure 10:
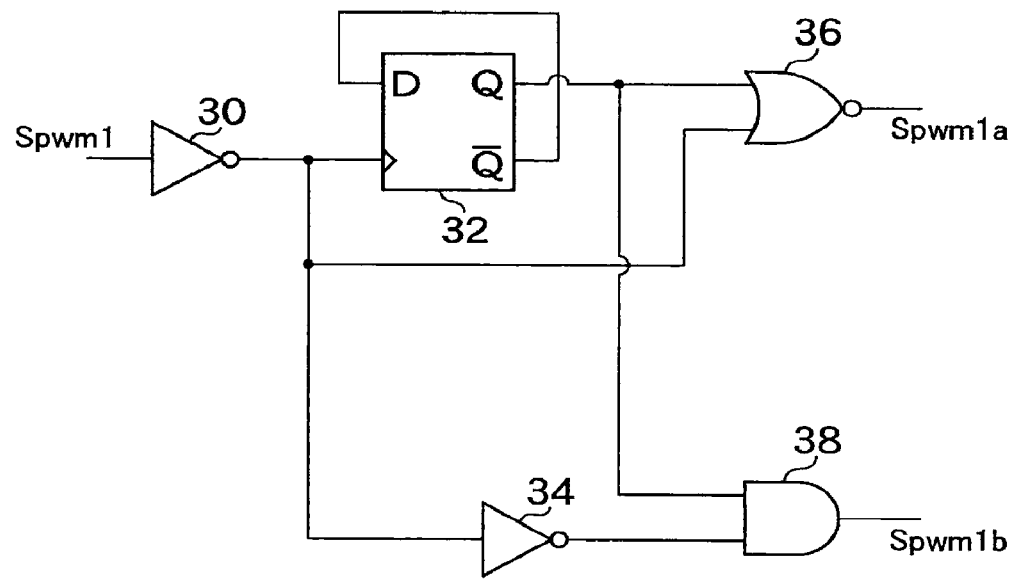
FIG. 10 is a circuit diagram which shows an example configuration of the divider.

FIG. 10 is a circuit diagram which shows a configuration example of the divider 14. The inverter 30 inverts the pulse signal Spwm1 for the high-side transistors. Via the clock terminal, the D flip-flop 32 receives the pulse signal #Spwm1 ("#" represents logical inversion) inverted by the inverter 30. The inverting terminal #Q of the D flip-flop 32 is connected to the input terminal D. The pulse signal Spwm1 for the high-side transistors is divided in half by the D flip-flop 32.

The NOR gate 36 outputs the NOR of the output of the inverter 30 and the output of the D flip-flop 32 as the pulse signal Spwm1a. The inverter 34 inverts the output of the inverter 30. The AND gate 38 outputs the AND of the output of the inverter 34 and the output of the D flip-flop 32 as the pulse signal Spwm1b. It should be noted that the configuration of the divider 14 shown in FIG. 10 has been described for exemplary purposes only, and the present invention is not restricted to such an arrangement.

Figure 11:
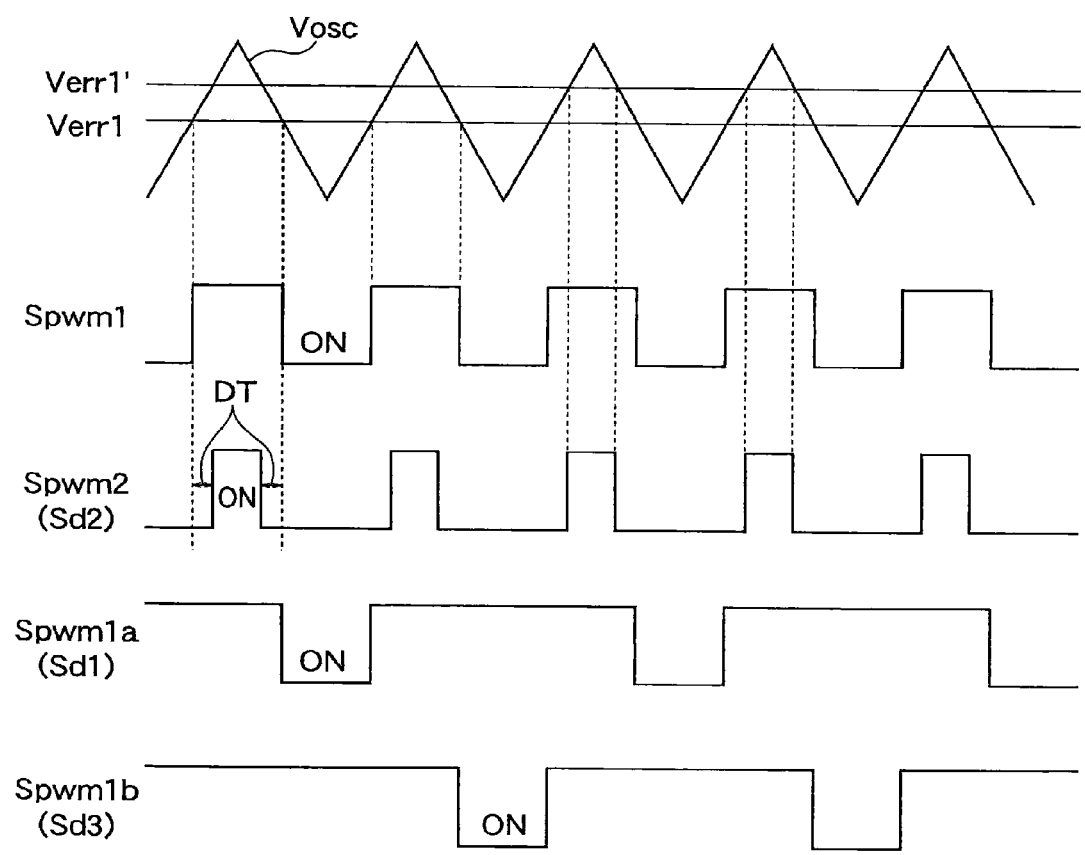
FIG. 11 is a time chart which shows the operation state of the control circuit shown in FIG. 8 in the fourth mode.

FIG. 11 is a time chart which shows the operation of the control circuit 100a shown in FIG. 8 in the fourth mode.

In the fourth mode, the pulse signal Spwm1 is divided in half by the divider 14, and the pulse signals Spwm1a and Spwm1b thus divided are supplied to the high-side transistor MH1 and the high-side transistor MH2, respectively. With such an arrangement, the pulse signals Spwm1a and Spwm1b correspond to the driving signals Sd1 and Sd3, respectively. Accordingly, these two high-side transistors MH1 and MH2 are alternately switched to the ON state. That is to say, the switching regulator 200 repeatedly performs an operation in which the first high-side transistor MH1 is switched to the ON state, the low-side transistor ML1 is switched to the ON state, the second high-side transistor MH2 is switched to the ON state, and the low-side transistor ML1 is switched to the ON state.

As a result, such an arrangement provides the advantage of reducing a continuous flow of the pulse current flowing through the first high-side transistor MH1 and the second high-side transistor MH2, as compared with an arrangement including a single high-side transistor.

In an experiment, under conditions in which the switching regulator 200d shown in FIG. 9B was operated at Vin=7 V, Vout=3.3 V, and a switching frequency of 1 MHz, the temperature around the high-side transistors MH1 and MH2 was measured, and was found to be 63° C. By comparison, an arrangement employing a single high-side transistor was operated under the same conditions, and the temperature around the single high-side transistor was found to be 74° C. That is to say, it has been confirmed that the temperature is reduced by nearly 10° C.

As described above, the fourth mode provides the advantage of reduced heat generation. The reduced heat generation allows the switching frequency to be raised as compared with conventional arrangements. Such an arrangement improves the stability of the output voltage Vout.

The control circuit 100a is configured so as to allow the driving mode to be switched between the fourth mode (alternative mode) in which the multiple switching transistors MH1 and MH2 are switched to the ON state in a time divisional manner and the fifth mode (normal mode) in which the multiple switching transistors MH1 and MH2 are driven according to the same pulse signal.

When these two high-side transistors MH1 and MH2 are to be set to the ON state at the same time, the control circuit 100a is set to the fifth mode. In the fifth mode, the first pulse signal Spwm1, which has not been divided, is distributed to the first driver DRV1 and the third driver DRV3. In other words, the control circuit 100a can be configured such that Sd1=Sd3.

The functions and operations of the second driver DRV2 are the same as those in the fourth mode.

In the fifth mode, the switching operations of the high-side transistor MH1 and the high-side transistor MH2 are performed at the same timing. That is to say, such an arrangement provides the same operation mode as conventional switching regulators including a single high-side transistor.

Also, by providing the normal mode, such an arrangement is capable of driving the switching transistor even in a case in which only a single transistor (either the high-side transistor MH1 or MH2) is provided as an external component to the control circuit 100a.

That is to say, by providing a function of switching the driving mode between the normal mode (fifth mode) and the alternative mode (fourth mode), such an arrangement provides the control circuit 100a with improved versatility.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

In the second mode, the fourth mode, or the fifth mode, the second driver DRV2 may amplify a signal having a duty ratio that corresponds to the first pulse signal Spwm1 output from the first comparator CMP1.

In this case, such an arrangement should include a selector, which selects either a signal that corresponds to the first pulse signal Spwm1 or the second pulse signal Spwm2, upstream of the second driver DRV2.

Description has been made with reference to FIG. 9B regarding a synchronous-rectification switching regulator as a target to be driven. Also, the switching regulator may include a rectifying diode, instead of the low-side transistor ML1.

Description has been made regarding an arrangement including two high-side transistors in the forth mode. Also, an arrangement may be made including three or more high-side transistors. With such an arrangement, the thermal dispersion effects become more marked.

Also, description has been made in the fourth embodiment regarding an arrangement in the fourth mode in which the pulse signal Spwm1 is divided in half so as to alternately switch the first high-side transistor MH1 and the second high-side transistor MH2 to the ON state. However, the present invention is not restricted to such an arrangement.

Stated in general terms, an arrangement may be made in which, with n (which is an integer) consecutive pulses as one pulse set, two pulse sets are generated, and these two sets are respectively distributed to the first high-side transistors MH1 and MH2. That is to say, the time chart in FIG. 11 shows an arrangement in which n=1. Also, an arrangement may be made in which n=2 or more.

Description has been made in the embodiment regarding an arrangement in which each high-side transistor MH is a P-channel MOSFET. Also, each high-side transistor MH may be an N-channel MOSFET.

In the switching regulator according to the embodiment, the switching transistors may be included within the control circuit 100 in the form of built-in components.

The present invention has been described with reference to the embodiments. However, it is needless to say that the above-described embodiments represent only mechanisms or applications of the present invention. Accordingly, it is needless to say that various modifications and changes may be made without departing from the spirit of the present invention.

What is claimed is:

1. A switching regulator which steps down or boosts an input voltage applied to an input terminal, and which outputs an output voltage stabilized to a predetermined target value via an output terminal, comprising:
    a plurality of switching transistors provided in parallel;
    an output circuit including an inductor, an output capacitor, and a rectifying device;
    a pulse modulator which generates a pulse signal with a duty ratio controlled such that the output voltage of the switching regulator approaches the predetermined target value; and
    a driver which distributes the pulse signal to the plurality of switching transistors, and which switches the plurality of switching transistors in a time divisional manner, wherein the driver comprises a divider configured to divide the pulse signal, and distributes a plurality of pulse signals thus divided to the plurality of switching transistors, and wherein
    the divider comprises:
        an first inverter configured to invert the pulse signal;
        a D flip-flop configured to receive the inverted pulse signal from the first inverter on its clock terminal, its inverting output terminal being connected to its input terminal;
        a NOR gate configured to generate a logical negative OR of the output of the first inverter and the output of the D flip-flop;
        a second inverter configured to invert the output of the first inverter; and
        an AND gate configured to generate an logical AND of the output of the second inverter and the output of the D flip-flop.

2. A switching regulator according to claim 1, wherein the driver is configured so as to allow the mode to be switched between an alternative mode in which the plurality of switching transistors are switched to the ON state in a time divisional manner and a normal mode in which the plurality of switching transistors are driven according to a single pulse signal.

3. A switching regulator according to claim 1, wherein the plurality of switching transistors have approximately the same device size.

4. A switching regulator according to claim 1, wherein the driver distributes the plurality of pulse signals thus divided, such that the plurality of switching transistors are sequentially switched to the ON state.

5. A switching regulator according to claim 1, wherein the rectifying device is a single synchronous rectifying transistor,
    and wherein the driver switches the synchronous rectifying transistor to the ON state with each cycle of the pulse signal.

6. A switching regulator according to claim 1, wherein the rectifying device is a diode.

7. A switching regulator according to claim 1, wherein the switching regulator is a step-down switching regulator,
    and wherein each of the plurality of switching transistors is a P-channel MOSFET.

8. A control circuit which controls the switching regulator according to claim 1, which includes the pulse modulator and the driver monolithically integrated on a single semiconductor substrate, and which controls ON/OFF operations of the plurality of switching transistors.

9. A control circuit for a switching regulator, comprising:
    a first input terminal which allows a first feedback voltage that corresponds to the output voltage of a first channel to be fed back;
    a second input terminal which allows a second feedback voltage that corresponds to the output voltage of a second channel to be fed back;
    a first error amplifier which amplifies the difference between the first feedback voltage and a first predetermined reference voltage;
    a second error amplifier which amplifies the difference between the second feedback voltage and a second predetermined reference voltage;
    a first pulse modulation comparator which compares a first error voltage output from the first error amplifier with a predetermined periodic voltage;
    a second pulse modulation comparator which compares a second error voltage output from the second error amplifier with the predetermined periodic voltage;
    a first driver which amplifies a first pulse signal output from the first pulse modulation comparator; and
    a second driver which amplifies a second pulse signal output from the second pulse modulation comparator,
    wherein, in a case in which a two-channel diode-rectifying step-down switching regulator is to be controlled, the control circuit is set to a first mode,
    and wherein, in a case in which a single-channel synchronous-rectifying step-down switching regulator is to be controlled, the control circuit is set to a second mode,
    and wherein, in the first mode, the output signals of the first and second drivers are respectively supplied to high-side transistors of the first and second channels of the diode-rectifying step-down switching regulator,
    and wherein, in the second mode, the output signal of the first driver is supplied to a high-side transistor of the single-channel synchronous-rectifying step-down switching regulator, and the output signal of the second driver, the duty ratio of which is set to a value that corresponds to the first feedback voltage, is supplied to a low-side transistor of the single-channel synchronous-rectifying step-down switching regulator.

10. A control circuit according to claim 9, wherein, in the first mode, the second pulse modulation comparator compares the second error voltage output from the second error amplifier with the predetermined periodic voltage, and wherein, in the second mode, the second pulse modulation comparator compares a voltage that corresponds to the first error voltage output from the first error amplifier with the predetermined periodic voltage.

11. A control circuit according to claim 10, wherein, in the second mode, the second pulse modulation comparator compares the voltage obtained by level-shifting the first error voltage with the predetermined periodic voltage.

12. A control circuit according to claim 11, further including a switch and a resistor provided in series between the output terminal of the first error amplifier and the output terminal of the second error amplifier, and wherein the switch is switched to the OFF state in the first mode, and is switched to the ON state in the second mode.

13. A control circuit according to claim 9, wherein, in the first mode, the second driver amplifies the second pulse signal output from the second pulse modulation comparator, and wherein, in the second mode, the second driver amplifies a signal having a duty ratio that corresponds to the first pulse signal output from the first pulse modulation comparator.

14. A control circuit according to claim 9, further including:

a third input terminal which allows a third feedback voltage that corresponds to the output voltage of a third channel to be fed back;

a third error amplifier which amplifies the difference between the third feedback voltage and a third predetermined reference voltage;

a third pulse modulation comparator which compares a third error voltage output from the third error amplifier with the predetermined periodic voltage; and a third driver which amplifies a third pulse signal output from the third pulse modulation comparator, wherein, in a case in which a 3-channel diode-rectifying step-down switching regulator is to be controlled, the control circuit is set to a third mode, and wherein, in the third mode, the output signals of the first through third drivers are respectively supplied to high-side transistors of the first through third channels of the diode-rectifying step-down switching regulator.

15. A control circuit according to claim 9, wherein, in a case in which a synchronous-rectifying step-down switching regulator including two high-side transistors connected in parallel is to be controlled, and complementary ON/OFF operations are to be performed for the two high-side transistors, the control circuit is set to a fourth mode, and wherein, in the fourth mode, the first pulse signal is divided, the pulse signals thus divided are distributed to the first driver and a third driver, the output signals of the first and third drivers are supplied to the two high-side transistors, and the output signal of the second driver, the duty ratio of which is set to a value that corresponds to the first feedback voltage, is supplied to a low-side transistor of the single-channel synchronous-rectifying step-down switching regulator.

16. A control circuit according to claim 9, wherein, in a case in which a synchronous-rectifying step-down switching regulator including two high-side transistors connected in parallel is to be controlled, and the two high-side transistors are to be switched to the ON state at the same time, the control circuit is set to a fifth mode, and wherein, in the fifth mode, the first pulse signal is distributed to the first and third drivers, the output signals of the first and third drivers are supplied to the two high-side transistors, and the output signal of the second driver, the duty ratio of which is set to a value that corresponds to the first feedback voltage, is supplied to a low-side transistor of the single-channel synchronous-rectifying step-down switching regulator.

* * * * *